United States Patent
Fedele (10) Patent No.: US 7,292,163 B1
(45) Date of Patent: Nov. 6, 2007

(54) CIRCUIT FOR AND METHOD OF ENCODING A DATA STREAM

(75) Inventor: Nicola J. Fedele, Kingston, NJ (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 11/404,411

(22) Filed: Apr. 14, 2006

(51) Int. Cl.
*H03M 7/40* (2006.01)

(52) U.S. Cl. .................................... 341/67; 382/246

(58) Field of Classification Search ............... 341/67, 341/65; 382/246
See application file for complete search history.

(56) References Cited

U.S. PATENT DOCUMENTS 6,646,578 B1 * 11/2003 Au ........................... 341/67
2005/0135691 A1 * 6/2005 Reese ....................... 382/246

OTHER PUBLICATIONS

Fedele, Nicola, J., "A Circuit For And Method of Decoding A Data Stream", U.S. Appl. No. 11/404,324, filed Apr. 14, 2006, 29 pages, available from Xilinx Inc., 2100 Logic Drive, San Jose, CA 95124.

* cited by examiner

*Primary Examiner*—Rexford Barnie
*Assistant Examiner*—Joseph Lauture
(74) *Attorney, Agent, or Firm*—John J. King (57) ABSTRACT

A circuit for encoding a data stream is described. The circuit comprises a non-zero count circuit coupled to receive the data stream and output a count of non-zero coefficients of a block of data of the data stream; a trailing ones detection circuit coupled to receive the data stream and output a number of trailing ones of the block of data; and a memory coupled to the non-zero count circuit and the trailing ones detection circuit and storing encoded data values, the memory outputting an encoded data value for a non-zero coefficient of a block of data based upon the count of non-zero coefficients and the number of trailing ones for the block of data. A method of encoding a data stream is disclosed.

17 Claims, 8 Drawing Sheets

CIRCUIT FOR AND METHOD OF ENCODING A DATA STREAM

FIELD OF THE INVENTION

The present invention relates generally to circuits for processing data, and in particular, to a circuit for and method of encoding a data stream.

BACKGROUND OF THE INVENTION

Receptors in the human eye are only capable of detecting light having wavelengths from 400 nm to 700 nm. These receptors are called cones and are of three different types, including one for red light, one for green light and one for blue light. If a single wavelength of light is observed, the relative responses of these three receptors allow us to discern what we call the color of the light. This phenomenon is extremely useful because it enables generating a range of colors by simply adding together various proportions of light from just three different wavelengths. The process, known as additive color matching, is utilized in color television systems. A resulting image to be displayed is broken down into an array of picture elements or pixels to be displayed.

Generally, each pixel displays a proportion of red, green or blue depending on the signals driven to the display. The representation of an image in red, green and blue is commonly referred to as RGB. However, transmitting or storing these RGB color components requires significant bandwidth. Accordingly, luminance and color difference coding is often used to reduce the bandwidth of an image to be displayed. For example, the YUV format contains a Y portion representing a luminance component (also known as Luma) associated with brightness and U and V portions representing chrominance components (also know as Chroma 1 and Chroma 2) associated with color. In addition to reducing bandwidth, the YUV format models human perception of color more closely than the standard RGB format.

As digital circuits become more prominent, more systems continue to migrate from analog systems to digital systems. However, as the bandwidth requirements for digital systems continue to increase, integrated circuits have a more difficult time processing the data. For example, analog television transmission is currently being replaced by high definition television (HDTV). Even with the reduced bandwidth provided by the YUV format, the HDTV format has significant data requirements. An HDTV image may have 1920×1080 pixels and may use six times the bandwidth of traditional standard-definition TV. Therefore, it is a challenge to economically distribute the new HDTV programming over existing satellite, cable, and IPTV networks.

Video compression is often used to reduce the amount of data to be transmitted in a data transmission network, such as a television broadcast network. One main video compression scheme may be found in the Motion Picture Experts Group (MPEG) standards. Video compression using one or more MPEG standards is currently implemented in a variety of video imaging devices, such as digital televisions, set-top boxes, digital satellite systems, HDTV decoders, DVD players, video conferences and web phones, for example. The MPEG standards employ a function called the Discrete Cosine Transform (DCT) that takes a square of pixel blocks, and removes redundant information that is imperceptible to the viewer. The received compressed data is then decoded using the Inverse Discrete Cosine Transform (IDCT) function.

A device designed to compress high definition advanced video coding (HD AVC) in real time may demand more than 500 billion operations per second. While conventional central processing units (CPUs) are extremely powerful, their architecture is not well suited to all video processing tasks. For example, block-based and pixel-level processing tasks require many compute cycles and are also very data-flow intensive. Therefore, implementing video processing in conventional CPUs requires complex register pipelines with fast memory access. Similarly, a programmable digital signal processor (DSP) is often limited by the number of instruction issues per cycle, the level of pipelining in the execution unit, and the maximum data width to fully feed the execution units. Video quality is often compromised as a result of the limited cycles available per task in a programmable DSP. Recursive algorithms such as infinite impulse response (IIR) filtering, variable-length coding (VLC) in the MPEG standards, and context-adaptive variable length coding (CAVLC) in the MPEG AVC standard are particularly inefficient when mapped to DSPs. That is, data recursion prevents inductive logic programming (ILP) from being used effectively. Finally, a DSP may not be suitable to incorporate a decoder and an encoder solution as required in some full duplexing implementations.

Accordingly, there is a need for an improved circuit for and method of a method of encoding a data stream.

SUMMARY OF THE INVENTION

A circuit for encoding a data stream is described. The circuit comprises a non-zero count circuit coupled to receive the data stream and output a count of non-zero coefficients of a block of data of the data stream; a trailing ones detection circuit coupled to receive the data stream and output a number of trailing ones of the block of data; and a memory coupled to the non-zero count circuit and the trailing ones detection circuit and storing encoded data values, the memory outputting an encoded data value for a non-zero coefficient of a block of data based upon the count of non-zero coefficients and the number of trailing ones for the block of data. The memory may comprise a plurality of lookup tables which outputs the encoded data value from a lookup table selected based upon a block number of a current macroblock being encoded.

According to an alternate embodiment, a circuit for encoding a data stream comprises a memory for storing coefficients of a block of data of the data stream; a zero run detection circuit coupled to the memory, the zero run detection circuit determining, for each non-zero coefficient, a run of zeroes adjacent to the non-zero coefficient; and a FIFO coupled to the zero run detection circuit, the FIFO storing a run length of zeros for each non-zero coefficient of the block of data read from the memory. The circuit may further comprise a non-zero count circuit coupled to receive the data stream, wherein the non-zero count circuit determines a number of non-zero coefficients of the block of data and wherein the memory comprises a field for storing a non-zero value indicator for each coefficient stored in the memory. A trailing ones detection circuit may also be coupled to receive the data stream, wherein the trailing ones detection circuit generates a number of trailing ones of the block of data. Finally, a level lookup table may be coupled to receive the coefficients of the memory, wherein the level lookup table generates a level code associated with each non-zero coefficient stored in the memory.

A method of encoding a data stream is disclosed. The method comprises steps of receiving a data stream comprising blocks of data; generating a count of non-zero coefficients for a block of data in a first hardware logic circuit; generating a trailing ones value for the block of data in a second hardware logic circuit; and generating encoded data for the block of data based upon the count of non-zero coefficients and the trailing ones value.

DETAILED DESCRIPTION OF THE DRAWINGS

Figure 1:
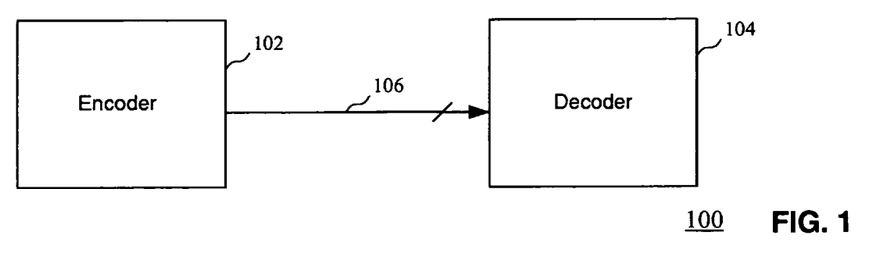
FIG. 1 is a block diagram of a system for encoding and decoding data according to an embodiment the present invention.

Turning first to FIG. 1, a block diagram of a system for encoding and decoding data according to an embodiment the present invention is shown. In particular, an encoder 102 is coupled to a decoder 104 by way of a communication link 106. The communication link may be any type of communication channel, including both wired and/or wireless communication channels. The system of FIG. 1 may be employed for video broadcasting to various locations over a wireline connection, for example, or the broadcast of a video to a cellular telephone over a wireless connection. While the system of FIG. 1 finds particular application in the broadcasting of video or other data to a receiver, additional applications require full duplexing. For example, as wireless mobile communication devices such as cellular telephones having camera functionality continue to improve, the applications for full duplexing continue to increase. Accordingly, the ability to compress data and transfer full duplex data in real time over a wireless network would be beneficial.

Figure 2:
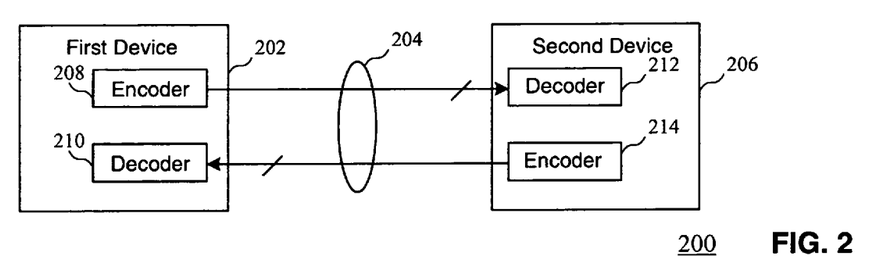
FIG. 2 is a block diagram for a full duplex system for communicating encoded data according to an embodiment of the present invention.

As shown in the block diagram of FIG. 2, a full duplex system for transmitting encoded data comprises a first device 202 coupled by a full duplex communication link 204 to a second device 206. The first device 202 comprises an encoder 208 for generating encoded data for transmission to the second device 206, and a decoder 210 for decoding data received from the second device. Similarly, the second device comprises a decoder 212 for decoding the encoded data received from the encoder 208 of the first device. An encoder 214 of the second device also generates encoded data which is coupled to the decoder 210 of the first device. While some applications for employing one directional and full duplex video transmissions have been given by way of example, it should be understood that the applications of the encoder and decoders described in more detail below are not limited to the described examples, but may extend to any other application for transmitting and/or receiving video data.

Figure 3:
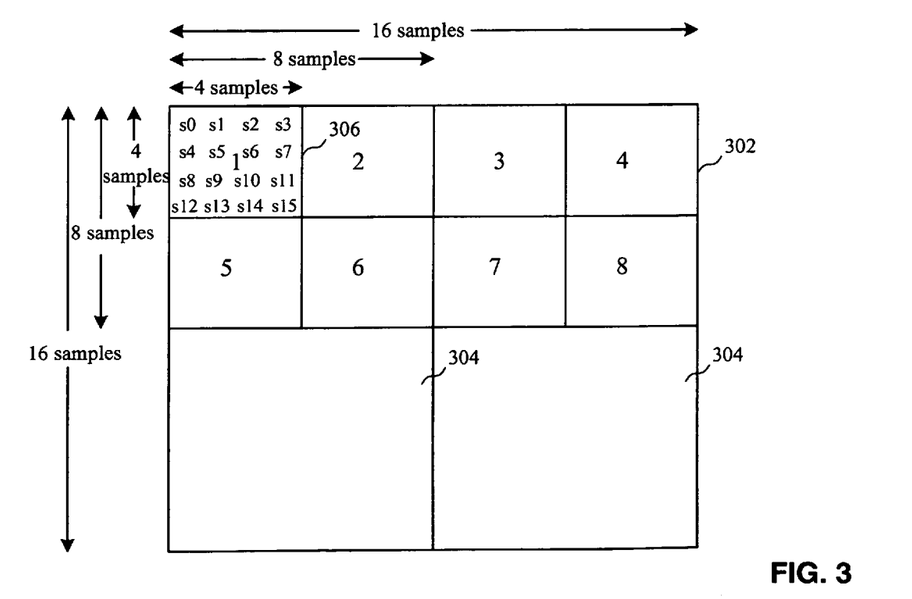
FIG. 3 is a diagram showing a macroblock and sub-blocks associated with a data stream according to an embodiment of the present invention.

Turning now to FIG. 3, a diagram shows a macroblock and sub-blocks associated with a data stream according to an embodiment of the present invention. A video image is assembled by the encoder in such a way that sections of the video frame are divided up into blocks. In particular, the macroblock 302 may comprise an array which may be partitioned into smaller arrays or sub-blocks commonly called blocks. For example, the macroblock 302 may be partitioned into 8×8 blocks 304 and/or 4×4 blocks 306, where each 8×8 block comprises four 4×4 blocks as shown in the top two rows of blocks. While the circuit and methods of the present invention may be used with arrays of other dimension or a macroblock having other combinations of sub-blocks, the implementation of the methods and circuits will be described with reference to a 16×16 macroblock having a plurality of 8×8 and 4×4 sub-blocks. The 4×4 sub-blocks of FIG. 3 contain 4 rows and 4 columns of samples comprising coefficients, by way of example.

A macroblock complying with the MPEG standards comprises six 8×8 blocks, generally designated blocks 0-5, where four of the blocks are associated with Luma (Y) data and one block is associated with each of the two components of Chroma information (U or V). That is, each pixel associated with the video image is represented by three channels, one for each of Luma, Chroma 1 and Chroma 2. The Luma information comprises four 8×8 blocks and the Chroma information for each of the Chroma 1 and Chroma 2 portions comprise one 8×8 block. The two-dimensional 4×4 blocks are converted to a one-dimensional string of 16 samples by addressing the two dimensional block in a zig-zag pattern. While data in the sub-blocks may correspond to Luma or Chroma data, the processing of the samples in the various macrolocks and sub-blocks will be performed in the same manner regardless of the type of data. The Luma and Chroma data of the six 8×8 blocks of coefficients which are processed are then used to generate the image.

Referring specifically to the macroblock of FIG. 3, a 4×4 sub-block comprises an array of 16 samples comprising coefficients, as shown in the first 4×4 sub-block, designated with a number 1. The data in the array may be read in the order s0 through s15. The 4×4 sub-blocks 2-8 also contain 16 samples as shown in sub-block 1, and the sub-blocks may be read sequentially from block 1 to block 8 as shown. The lower blocks 304 may also comprise 4×4 blocks which may be read sequentially as shown with respect to the upper sub-blocks 1-8. As will be described in more detail below, data from an adjacent macroblock may be used to compress data of a given macroblock. For example, a method or circuit of compressing data for a given macroblock may use data from a macroblock which is immediately above and a macroblock which is immediately to the left of a current macroblock, as will be described in more detail below.

The 16 samples of the sub-block may comprise non-zero values and zero values. Some of the non-zero values will be a value of plus or minus one. When implementing a compression algorithm according to the MPEG standards, data representative of the values of the matrix will be generated to encode the data. For example, the total number of non-zero samples will be transmitted to the decoder as the total number of coefficients. The number of zero samples between the non-zero samples will also be transmitted. As will be described below, the number of zeros associated with a non-zero sample may represent the number of zeros before a non-zero sample, or after a non-zero sample, depending upon the selected protocol. The total number of bits comprising the encoded data will also be transmitted. As will be described in reference to the various blocks of the encoder and decoder circuits described below, the data associated with samples of the matrix will be encoded by the encoder when the data is received, and used by the decoder when the encoded data is decoded by the decoder in a reverse fashion.

Figure 4:
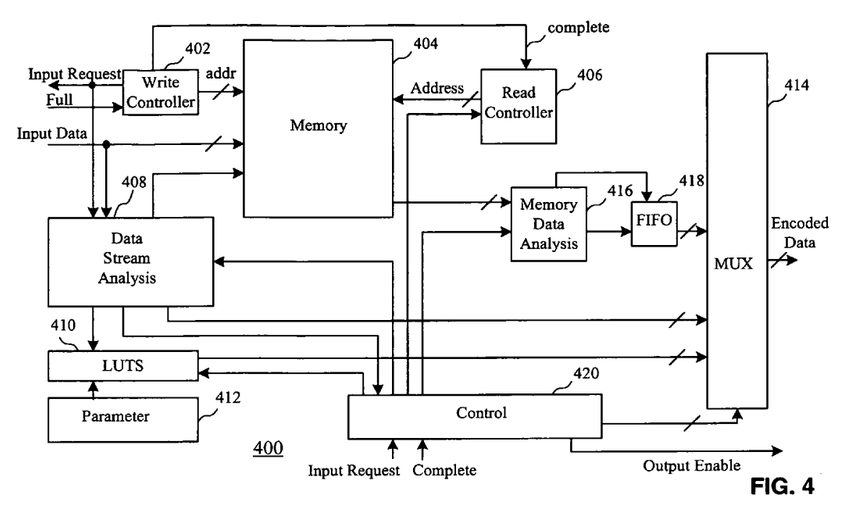
FIG. 4 is a block diagram of an encoder according to an embodiment of the present invention.

Turning now to FIG. 4, a block diagram of an encoder according to an embodiment of the present invention is shown. In particular, a write controller 402 generates an address which is coupled to a memory 404 for storing input data coupled to the memory. A read address generated by read controller 406 will enable reading data from the memory. An input request and the input data are also coupled to a data stream analysis block 408. The data stream analysis block 408 will analyze the data and output information related to the data for enabling compression of the data. The results of the data analysis will be coupled to both the memory 404 and a block of look-up tables 410. Parameters 412 which depend upon the input data are also coupled to the block of look-up tables 410 in order to determine which look-up table to select. Based upon the results of the data analysis and other parameters, a value from the lookup table will be used to generate the encoded data by a multiplexer 414. The data stream analysis block will also generate an output coupled to the multiplexer 414 for generating the encoded data.

The data stored in the memory 404 may also be analyzed to generate an input to the multiplexer 414 to generate the encoded data. That is, the stored input data and data generated by the data stream analysis block 408 are further analyzed by the memory data analysis block 416. The output of the memory data analysis block 416 may be stored in a FIFO 418. As will be described in more detail below, storing the output of the memory data analysis block 416 may avoid additional steps of reading data from the memory. A control circuit 420 controls the various blocks which provide inputs to the multiplexer 414 to enable the multiplexer to generate the encoded data. That is, the control circuit 420 controls the multiplexer to concatenate the outputs of the various blocks to generate the encoded data. Accordingly, the encoded data may be based upon a number of values generated by the circuit of FIG. 4 in response to analyzing the input data. Additional examples of various parameters and outputs of the various blocks will be described in more detail in reference to FIG. 5

Figure 5:
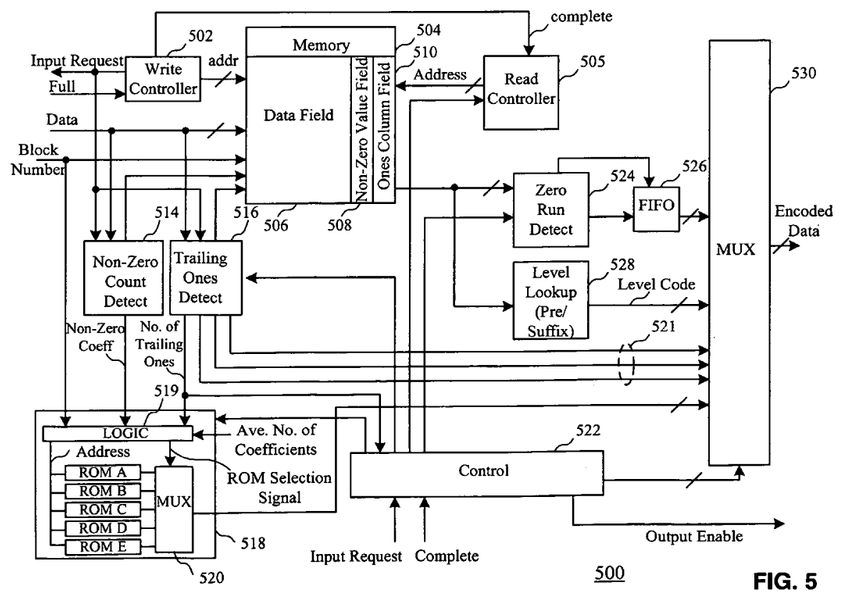
FIG. 5 is a block diagram of an encoder according to an alternate embodiment of the present invention.

Turning now to FIG. 5, a block diagram of an encoder according to an alternate embodiment of the present invention is shown. In particular, a write controller 502 generates an address which is coupled to a memory 504 for storing input data coupled to the memory. A read address generated by read controller 505 will enable reading data from the memory. The memory 504 preferably comprises a data field 506 for storing data comprising the coefficients of the macroblock, and a non-zero value field 508 for indicating whether any coefficients of the array loaded into memory are non-zero values. The non-zero value field may store, for example, a single bit indicating whether the corresponding data field comprises any non-zero values to determine whether the data must be encoded. For example, if all of the values are zeros, the data for the sub-block need not be encoded. For data having non-zero coefficients, a portion of the encoded data will indicate how many samples are zero before a non-zero coefficient, for example. Although the number of zeros after a non-zero coefficient may be included in the encoded data, the number of zeros before the non-zero coefficient will be used by way of example in the following description of circuits.

Further, a ones column field 510 stores data indicating the number and location of a last run of ones. The last run of ones, also called trailing ones indicate how many of the last non-zero values are ones, up to a total of three ones. Accordingly, there may be anywhere from zero to three values (e.g., a one bit) in a ones column field indicating that the corresponding value in the data field is a one in a last run of ones. For example, if the last three non-zero values are each a one, there would be three bits in the ones column field indicating that the corresponding values are ones of a last run of ones. In contrast, if the sequence of samples includes only a single one in a last run of ones, for example where the last two non-zero values comprise a three followed by a one, there would only be a single bit in the ones column field indicating that the value is a trailing one. The bits in the ones column field also enable a determination of where the last non-zero value should be placed before a final run of zeros. When the number of zeros before a non-zero coefficient is used to encode the data, the final run of zeros may be determined based upon the known total of number of coefficients and each of the number of non-zero coefficients and the run of zeros before the non-zero coefficients. A value in each of non-zero value field 508 and ones column field 510 corresponds to a sample written to memory and will be used when a read controller 505 enables reading data from the memory for generating the encoded data. The reconstruction of the decoded data will be described in more detail below related to decoding circuits.

An input request and the input data are also coupled to a non-zero count detect circuit 514 for determining whether any of the coefficients of the block are non-zero. The non-zero count detect circuit 514 is used to provide data for the non-zero value field 508. The non-zero count detect circuit also generates the number of non-zero coefficients of the sub-block being read. A trailing ones detect circuit 516 will also receive the input request and the input data, and generates a signal indicating the locations of the trailing ones to be stored in the ones column field 510. The non-zero detect circuit 514 and the trailing ones detect circuit 516 will provide the number of non-zero coefficients and the number of trailing ones, respectively, to a memory 518 comprising a plurality of look-up tables which may comprise read-only memories (ROMs) designated ROM A-ROM E used to generate encoded data.

The memory block 518 comprises logic 519 for receiving the block number of the macroblock being processed, the number of non-zero coefficients for the current block being processed, the number of trailing ones for the current block, and the average number of coefficients (which will be described in reference to FIG. 8). A multiplexer 520 selects one of a plurality of ROMs storing data based on the block number and the average number of coefficients. The five ROMS shown here by way of example may comprise four ROMs associated with blocks having Luma data and one ROM storing data associated with blocks having Chroma data. The number of non-zero coefficients, the number of trailing ones and the average number of non-zero coefficients are used to address a ROM which has been selected by the multiplexer 520 based upon the block number and the average number of the non-zero coefficients. The output of the look-up table will be described in more detail in reference to the decoder circuit of FIG. 7. The trailing ones detect circuit 516 also outputs a three bit value 521 representing the positive and negative values of up to three possible trailing ones in the run of last ones.

The data stored in the memory 504 may also be analyzed to generate the encoded data. The stored coefficients and data generated by the non-zero count detect circuit 514 and trailing ones detect circuit 516 are further analyzed by a zeros run detect circuit 524. That is, the zeros run detect circuit will determine, for a given non-zero coefficient stored in the memory, how many coefficients of the sub-block before the given non-zero coefficient have zero values. The output of the zeros run detect circuit 524 may stored in a FIFO 526, which will prevent having to re-read data from the memory. In particular, because the non-zero coefficients are preferably sent before the value representing the run of zeros before the non-zero coefficient, it is necessary to store the data in a FIFO to determine the runs of zeros between non-zero coefficients without re-reading the data. A level look-up circuit 528 also receives the output of the memory and determines a level code associated with the non-zero coefficients in the field. Finally, the control circuit 522 controls a multiplexer 530 to select the various signals to generate the encoded data. As will be described below in reference to FIG. 9, the output of the level lookup circuit 528 comprises a level code used for encoding the non-zero coefficients of the data, where a non-zero coefficient may be a value from a positive 256 to a negative 256, for example.

By way of example for describing both the encoding circuits and the decoding circuits, the value in a given sub-block according to the following Example 1 may be:
    0,3,0,0,1,−1,−1,0,1,0,0,0,0,0,0.

As may be seen in this example, there are five non-zero coefficients in the block of data. The number of trailing ones is equal to three. That is, each of the last three non-zero coefficients is "1." Although the last four non-zero coefficients also happen to be a "1," it is only necessary to determine how many of the last three non-zero coefficient values have a value of "1." A level code is designated for the values of "1" and "3" in the Example 1. For example, a level code of "1" may be set for the value of "1," and a level code of "0010" may be set for the value of "3." Finally, a value for the run of zeros before each of the non-zero coefficients is included. In the above Example 1, a run of zeros value before the first "1" will be one because there is one "0" before the "1." The run of zeros before each "−1" will be zero. The run of zeros before value for the next "1" will be a two because there are two values of "0" before the "1." Finally, the run of zeros before the "3" will be one because there is one "0" before the "3." These values established during the encoding of the samples are used by the decoder to reproduce the samples of the sub-block. As will be described in reference to FIG. 7, the number of zeros after the last non-zero coefficient may be calculated when decoding the data. The encoder circuits of FIGS. 4 and 5 may be implemented in hardware. For example, the circuits may be implemented in the various blocks of a programmable logic device, such as the programmable logic device described in detail in reference to FIGS. 11 and 12 described below.

Figure 6:
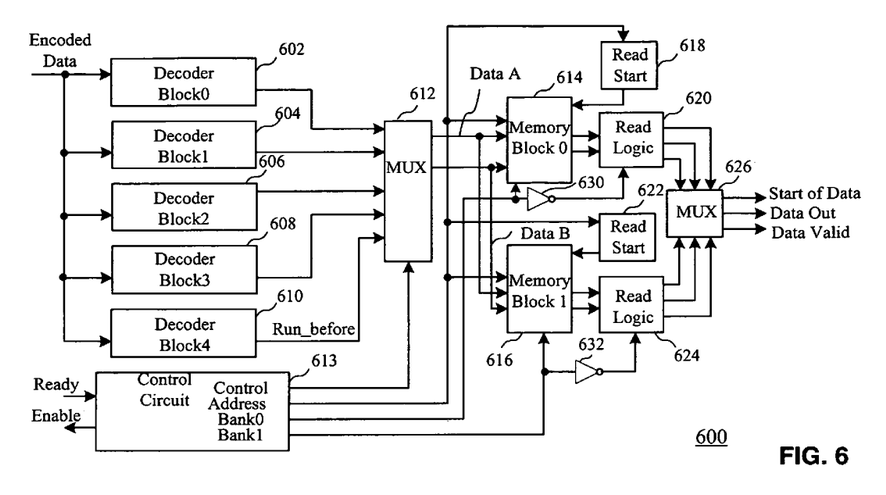
FIG. 6 is a block diagram of a decoder according to an embodiment of the present invention.

Turning now to FIG. 6, a block diagram of a decoder according to an embodiment of the present invention is shown. In designing a decoder, such as an AVC decoder codec, it is necessary to parse the encoded bitstream in a timely manner to handle high data rates of high definition compressed images. The circuit of FIG. 6 provides a parallel hardware architecture that selectively decodes portions of the bitstream comprising encoded data which was generated in a predetermined order by the controller 522 and the multiplexer 530 of FIG. 5, for example. That is, the hardware is broken into a number of functional processing blocks that parse specific sections of the compressed bitstream. The processing blocks are linked together by a control unit that activates each module at the appropriate moment that predetermined bits are aligned to the appropriate logic block.

In particular, a plurality of blocks 602-610 each receive the input data comprising encoded data. An output of each of the blocks is coupled to a multiplexer 612 which is controlled by a control circuit 613 to enable selecting the output of one of the blocks to receive the desired decoded data. Because the encoded data input to each of the blocks comprises data in a predetermined format having various fields which are to be decoded by one of the blocks of the blocks 602-610, and the control circuit 613 knows the format of the fields of the encoded input data, the control circuit may select the correct input to the multiplexer in order to select the data decoded by one of the blocks at the appropriate time. The data is then stored in a memory. Preferably, the data is stored in one of two memory blocks 614 and 616 selected by the control circuit to enable both writing and reading at the same time. The selected memory is used to store all of the non-zero samples as a bitstream is decoded. It also has a location associated with each value that will be indicative of the number of zeros that preceed that value, if any zeros exist. Once all of the information has been processed and stored into the memory, the read address generator will access the memory and display the compressed decoded sequence as it was encoded. Each coefficient also stored in a given memory location as various fields of the encoded data are decoded. Accordingly, the data is output from the decoder based upon data blocks having all zero values, which will be interleaved with data blocks having non-zero values.

In particular, each memory block is coupled to read logic and an output multiplexer to generate the appropriate output data. A read start generator 618 is coupled to the memory 614. The read start generator 618 and the memory 614 receives an address, and the read start circuit 618 provides a read start signal to the memory 614. Memory 614 and read logic 620 are coupled to receive a selection signal from the control circuit 613. Similarly, memory 616 and a read start generator 622 are coupled to receive an address from the control circuit. The read start circuit 622 provides a read start signal to the memory 616. An inverter 630 is used for generating opposite enable signals to the memory block 614 and the corresponding read logic 620 so that when the read logic is enabled, the memory block is disabled for writing. Similarly, an inverter 632 is used for generating opposite enable signals to the memory block 616 and the corresponding read logic 624. A multiplexer 626 selects the output of one of the read logic circuits to generate output data comprising Start of Data, Data Out, and Data Valid signals where the Data Out comprises the decoded data.

Figure 7:
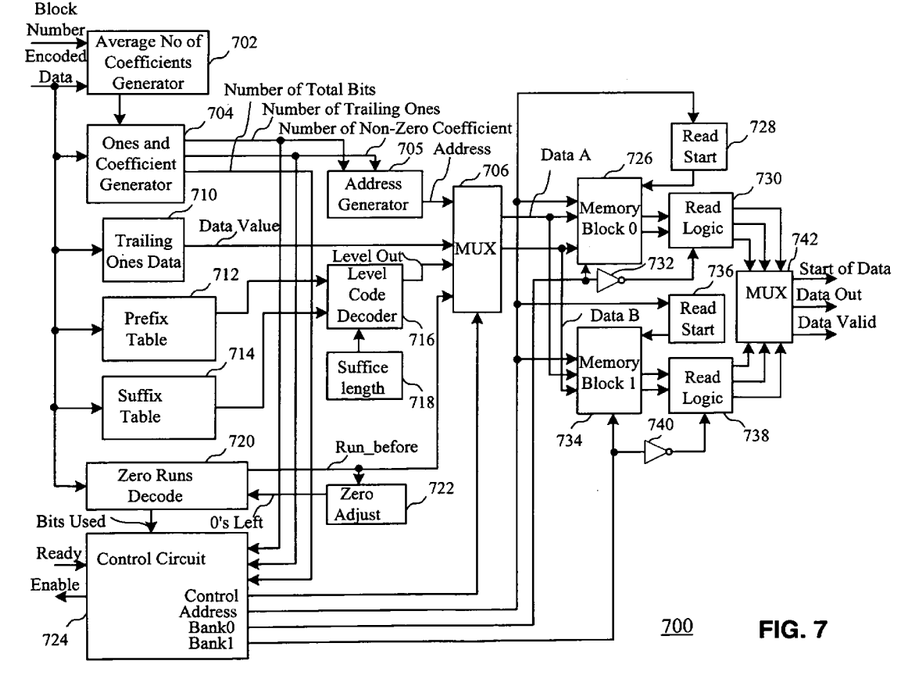
FIG. 7 is a block diagram of a decoder according to an alternate embodiment the present invention.

Turning now to FIG. 7, a block diagram of a decoder according to an alternate embodiment the present invention is shown. According to the embodiment of FIG. 7, the blocks 602-610 of FIG. 6 are replaced with specific processing blocks for decoding specific portions of the encoded data. An average number of coefficients generator 702, which will be described in more detail in reference to FIG. 8, receives a data block number and the encoded data, and generates an average number of coefficients associated with the given macroblock. The input data comprising encoded data is coupled in parallel to a plurality of decoder blocks including a ones and coefficient generator 704. The ones and coefficient generator outputs various signals, including a number of non-zero coefficients, a number of trailing ones, and a total number of bits of encoded data for the block, as will also be described in more detail in reference to FIG. 8. The total number of bits represents the number of bits of the compressed data, which may vary depending upon the number of non-zero coefficients, for example. The output signals of the ones and coefficient generator 704 will be couled to an address generator 705 for generating an address coupled to a multiplexer 706. The value of the address will be described in more detail in reference to FIG. 10. A trailing ones data circuit 710 will also output a data value indicating a positive or negative one associated with a decoded number of trailing ones to the multiplexer 706.

The input data is also decoded by a prefix table 712 and a suffix table 714, which couple a prefix and suffix respectively to a level code circuit 716. The prefix table may be, for example, a Huffman table or some other prefix-free code table. A suffix length circuit 718 provides a suffix length signal to the level code decoder 716. As described above with respect to the encoder, the output of the level code decoder represents the decoded value of a non-zero coefficient. The generation of the output of the level code decoder will be described in more detail in reference to FIG. 9. The total run-length decoder 720 is a decoder block that determines the location and number of zero values that are placed between the non-zero coefficients. For example, the zeros run decoder may have four different tables such as Huffman tables that are used to determine where the zeros are placed within any of the sixteen samples. Finally, a zero adjust circuit 722 will output a number of zeros remaining in the sequence based upon the total number of coefficients and the total number of non-zero coefficients and the corresponding runs of zeros before the non-zero coefficients.

An output of each of the blocks is coupled to a multiplexer 706, which is controlled by a control circuit 724 to enable selecting the output of one of the blocks to receive the desired decoded data at a predetermined time. Because the encoded data input to each of the blocks comprises data in a predetermined format having various fields which are decoded by a one of the processing blocks, the control circuit may then select the correct input to the multiplexer in order to select the data decoded by one of the blocks. Preferably, the data is stored in one of two memory blocks selected by the control circuit to enable both writing and reading of the separate memories at the same time. Each memory block is coupled to receive an address for reading or writing, and is coupled to read logic and an output multiplexer to generate the appropriate output data. In particular, a read start generator 728 receives an address from the controller 724 and couples a read signal to the memory 726. The read start generator 728 receives the address generated by the control circuit so that the read logic will correctly read from the last address to which data has been written, as will be described in more detail in reference to FIG. 10. Read logic 730 is coupled to receive a selection signal (i.e., bank0) from the control circuit 724. An inverter 732 is used for generating opposite enable signals to the memory block 726 and the corresponding read logic 730 so that when the read logic is enabled, the memory block is disabled for writing. Similarly, a read start generator 736 is coupled to receive an address from the control circuit, while a read logic circuit 738 enables reading from the memory block 734. An inverter 740 is used for generating opposite enable signals to the memory block 734 and the corresponding read logic 738. A multiplexer 742 selects the output of one of the read logic circuits to generate output data comprising Start of Data, Data Out, and Data Valid signals.

Figure 8:
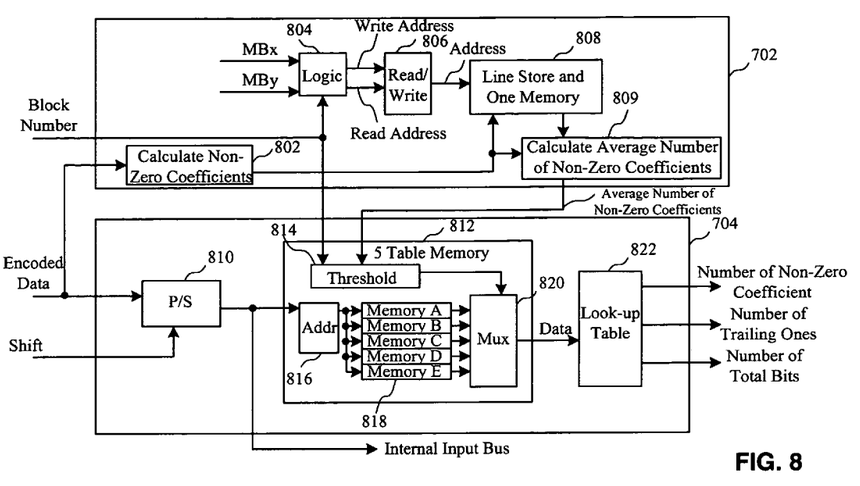
FIG. 8 is a block diagram of a coefficient generator according to an embodiment of the present invention.

Turning now to FIG. 8, a block diagram of the average number of coefficients generator 702 and the ones and coefficient generator 704 according to an embodiment of the present invention is shown. The average number of coefficients generator comprises a logic circuit coupled to receive row and column signals $MB_x$ and $MB_y$ to indicate the macroblock being analyzed. For example, a plurality of macroblocks may also be arranged in an array. As will be described in more detail below, the average number of coefficients for a block may be defined based upon the number of coefficients for the macroblock immediately above and the macroblock immediately to the left of the current macroblock, for example. A non-zero coefficients circuit 802 receives the encoded data and generates a non-zero coefficient value for the current sub-block of the macroblock being decoded. The logic circuit 804 generates a read address or a write address to a read/write circuit 806. Depending upon whether data is being stored in the line store or read from the line store to calculate an average number of coefficients, the address is provided to a line store and one memory circuit 808. For example, the average number of non-zero coefficients for each macroblock of a previous line of macroblocks is coupled to the line store and one memory 808, for use in calculating the average number of coefficients. The current line of macroblocks is then processed by the non-zero coefficients circuit 802 to generate the number of coefficients for the blocks of the macroblocks of the line having the current macroblock, and the average number of coefficients for each macroblock of the line of macroblocks. As will be described in the operation of the circuit, the line store and one memory circuit 808 will eliminate re-reading of data of the previous line of macroblocks which would otherwise be necessary to calculate an average number of coefficients for blocks of a macroblock. That is, the line store and one memory circuit 808 will enable access to the average number of non-zero coefficients of the macroblock immediately above the current macroblock being processed, while the non-zero coefficients circuit 802 enables access to the average number of coefficients of the macroblock immediately to the left of the current macroblock. The read/write circuit enables writing data from a previous line of macroblocks stored in the line store and one memory 808 to the block 809 for calculating the average number of non-zero coefficients. The writing of data to the block 809 is followed by reading of the current line of macroblocks to be stored in the line store and one memory 808 for use in calculating the average number of coefficients for macroblocks in the next line of macroblocks.

The block 809 for calculating the average number of non-zero coefficients receives both the number of non-zero coefficients associated with the current block being analyzed, as well as the average value for other macroblocks. According to one embodiment, the average number of coefficients nC for a current block may be calculated based upon an average number of coefficients of other blocks as:

$$nC=(nA+nB)/2$$

where nA is the average number of non-zero coefficients in the macroblock to the left and nB is the average number of non-zero coefficients in the macroblock above the current macroblock. While it is possible to retain the value of the average number of non-zero coefficients in the macroblock to the left of the current macroblock because it has just been read, it would be necessary to re-read the data of the macroblock above the current macroblock in order to obtain the average non-zero coefficient value. Accordingly, the use of the line store and one memory 808 provides a useful benefit in calculating the average number of coefficients by eliminating re-reading of data of previous line of macroblocks.

Because the average non-zero coefficients value is also used to determine which ROM in the memory 518 of FIG. 5 is selected to generate encoded data, it is also used in decoding the encoded data by the ones and coefficients generator. The ones and coefficient generator 704 comprises a parallel-to-serial converter 810 for receiving the encoded data and coupling a serial output to a memory 812 comprising multiple decoder tables. For example, the memory such as a ROM may contain a set of five Huffman tables that decode a portion of the encoded data to generate the total number of bits of encoded data, the number of trailing ones and the number of non-zero coefficients. A threshold circuit 814 is coupled to receive the block number and the average number of coefficients in order to determine which of the memories should be selected. The circuit further comprises an address generator 816 coupled to the plurality of memories A-E. As the data is loaded on a bit-by-bit basis, the address generator will determine whether there is a match between the input address and a value in the memory. Finally, a look-up table 822 coupled to receive the output of the multiplexer 820 will generate values used by the decoder, as described above in reference to FIG. 7. In particular, the output of the look-up table will provide the number of non-zero coefficients, the number of trailing ones and a number of total bits of encoded data.

Figure 9:
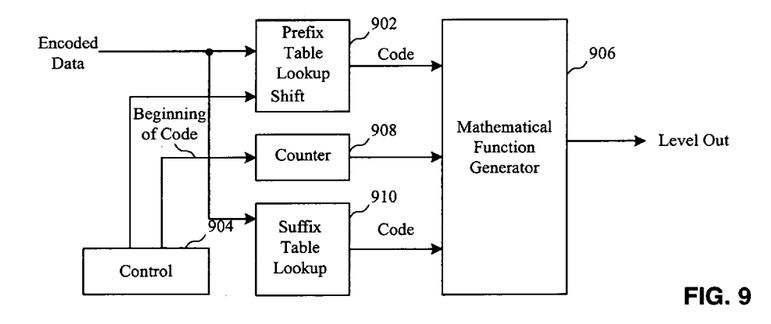
FIG. 9 is a block diagram of a level code generator according to an embodiment of the present invention.

Turning now to FIG. 9, a block diagram of prefix and suffix table according to an embodiment of the present invention is shown. In particular, a prefix table lookup circuit 902 receives encoded data and a shift control signal from a control circuit 904. The prefix table lookup circuit 902 couples a code to a function generator 906 for generating a level out signals based upon an output of a counter 908 and a suffix table look-up 910. As described above, depending upon the number of bits defining the encoded level value, the output of the prefix table lookup, and in some cases the output of the suffix table lookup, will be used by a mathematical function generator to generate a level out value. The level out value comprises the decoded level code of the coefficient stored in the memory.

Figure 10:
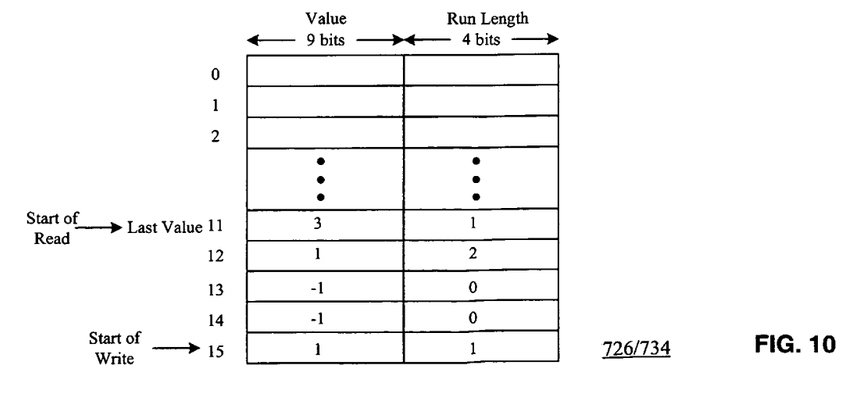
FIG. 10 is a block diagram of an internal memory for storing decoded data according to an embodiment of the present invention.

Turning now to FIG. 10, a block diagram of an internal memory for storing decoded data according to an embodiment of the present invention is shown. In particular, each memory block 726 and 734 comprises a storage location for each sample of a sub-block, which in our example of FIG. 3 having 16 samples (s0-s16) would comprise 16 storage locations. A first portion of the stored data is the coefficient itself, shown here as 9 bits which may represent eight bits for a value between 1-256, and a bit for a sign of the coefficient. The second portion represents a run length of zeros before the non-zero coefficient, which may be four bit in the case of a 16 bit block. That is, because the maximum run length for a non-zero value in a block would be fifteen, four bits would be necessary to represent between zero and fifteen bits of the run length (i.e., the number of zero values before another non-zero value). For example, if the last sample, s15, is the only non-zero value, then the value for s15 is entered in the value portion of the memory, and a value of 15 is entered in the run length indicating that there are fifteen zeros before the non-zero value of the sample s15.

It should also be noted that the data is preferably written from the last memory location, and read back from the memory location from where the last value was stored. In our example set forth above with five values, the values would be loaded between memory location 15 and 11, where the first value to be stored (e.g., a 1 in the Example 1) is stored in memory location 15. When the output data is generated, it would be generated using the run lengths to determine where to insert zero values between the stored values in memory locations 11 through 15. The data would also be read back from the last value that was stored (e.g., a 3 in memory location 11 in Example 1), and reconstructed in the final data format after all of the values have been read back. For example, although only five values would be stored in the memory locations 15-11, the decoded output data would be as shown in the Example 1 above when generated at the output of the decoder. In a case where none of the stored values has any run length, all of the values would be read back sequentially, and the run length for each of the stored values would be zero.

Figure 11:
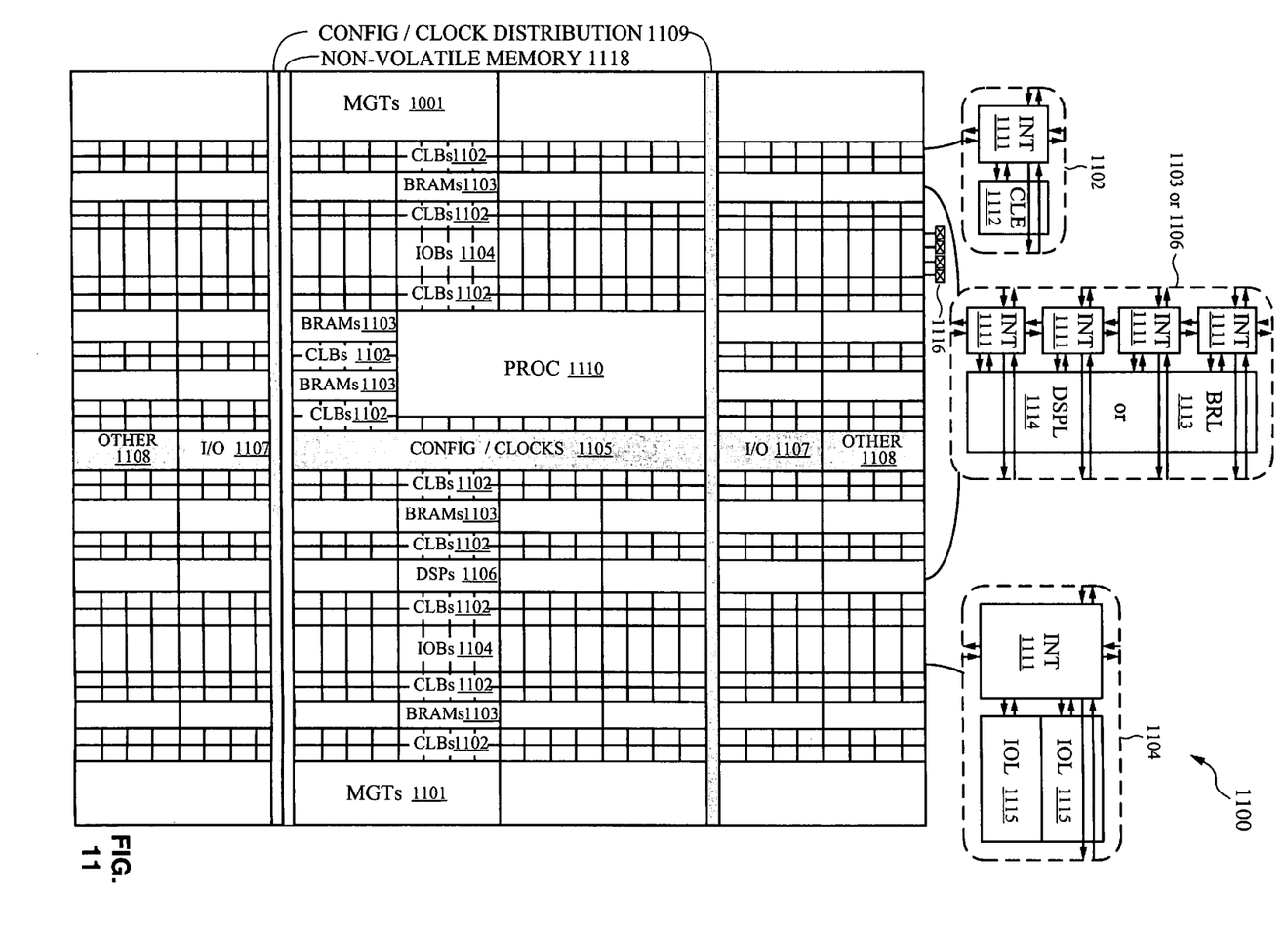
FIG. 11 is a block diagram of programmable logic device for implementing various elements of the circuits of FIGS. 1-10 according to an embodiment of the present invention.

Turning now to FIG. 11 is a block diagram of programmable logic device for implementing various elements of the circuits of FIGS. 1-10 according to an embodiment of the present invention is shown. The FPGA architecture 1100 of FIG. 11 includes a large number of different programmable tiles including multi-gigabit transceivers (MGTs 1101), configurable logic blocks (CLBs 1102), random access memory blocks (BRAMs 1103), input/output blocks (IOBs 1104), configuration and clocking logic (CONFIG/CLOCKS 1105), digital signal processing blocks (DSPs 1106), specialized input/output blocks (I/O 1107) (e.g., configuration ports and clock ports), and other programmable logic 1108 such as digital clock managers, analog-to-digital converters, system monitoring logic, and so forth. Some FPGAs also include one or more dedicated processor blocks (PROC 1110). The various blocks of the encoder and decoder circuits may be implemented in the CLBs, while control circuits may also be implemented in CLBs or by a dedicated processor block.

In some FPGAs, each programmable tile includes a programmable interconnect element (INT 1111) having standardized connections to and from a corresponding interconnect element in each adjacent tile. Therefore, the programmable interconnect elements taken together implement the programmable interconnect structure for the illustrated FPGA. The programmable interconnect element (INT 1111) also includes the connections to and from the programmable logic element within the same tile, as shown by the examples included at the top of FIG. 11.

For example, a CLB 1102 may include a configurable logic element (CLE 1112) that may be programmed to implement user logic plus a single programmable interconnect element (INT 1111). A BRAM 1103 may include a BRAM logic element (BRL 1113) in addition to one or more programmable interconnect elements. The BRAM comprises dedicated memory separate from the distributed RAM of a configuration logic block. Typically, the number of interconnect elements included in a tile depends on the height of the tile. In the pictured embodiment, a BRAM tile has the same height as four CLBs, but other numbers (e.g., five) may also be used. A DSP tile 606 may include a DSP logic element (DSPL 1114) in addition to an appropriate number of programmable interconnect elements. An IOB 1104 may include, for example, two instances of an input/output logic element (IOL 1115) in addition to one instance of the programmable interconnect element (INT 1111). As will be clear to those of skill in the art, the actual I/O pads 1116 connected, for example, to the I/O logic element 1115 are manufactured using metal layered above the various illustrated logic blocks, and typically are not confined to the area of the input/output logic element 1115.

In the pictured embodiment, a columnar area near the center of the die (shown shaded in FIG. 11) is used for configuration, clock, and other control logic. Horizontal areas 1109 extending from this column are used to distribute the clocks and configuration signals across the breadth of the FPGA. Some FPGAs utilizing the architecture illustrated in FIG. 11 include additional logic blocks that disrupt the regular columnar structure making up a large part of the FPGA. The additional logic blocks may be programmable blocks and/or dedicated logic. For example, the processor block PROC 1110 shown in FIG. 11 spans several columns of CLBs and BRAMs. Finally, a non-volatile memory 1118 may be employed for on-chip storage of configuration data which is used to configure the configuration logic blocks or other programmable tiles as described above.

Note that FIG. 11 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 11 are purely exemplary. For example, in an actual FPGA more than one adjacent column of CLBs is typically included wherever the CLBs appear, to facilitate the efficient implementation of user logic. Similarly the circuits and methods of the present invention may be implemented in any device, including any type of programmable logic device, having configuration memory.

Figure 12:
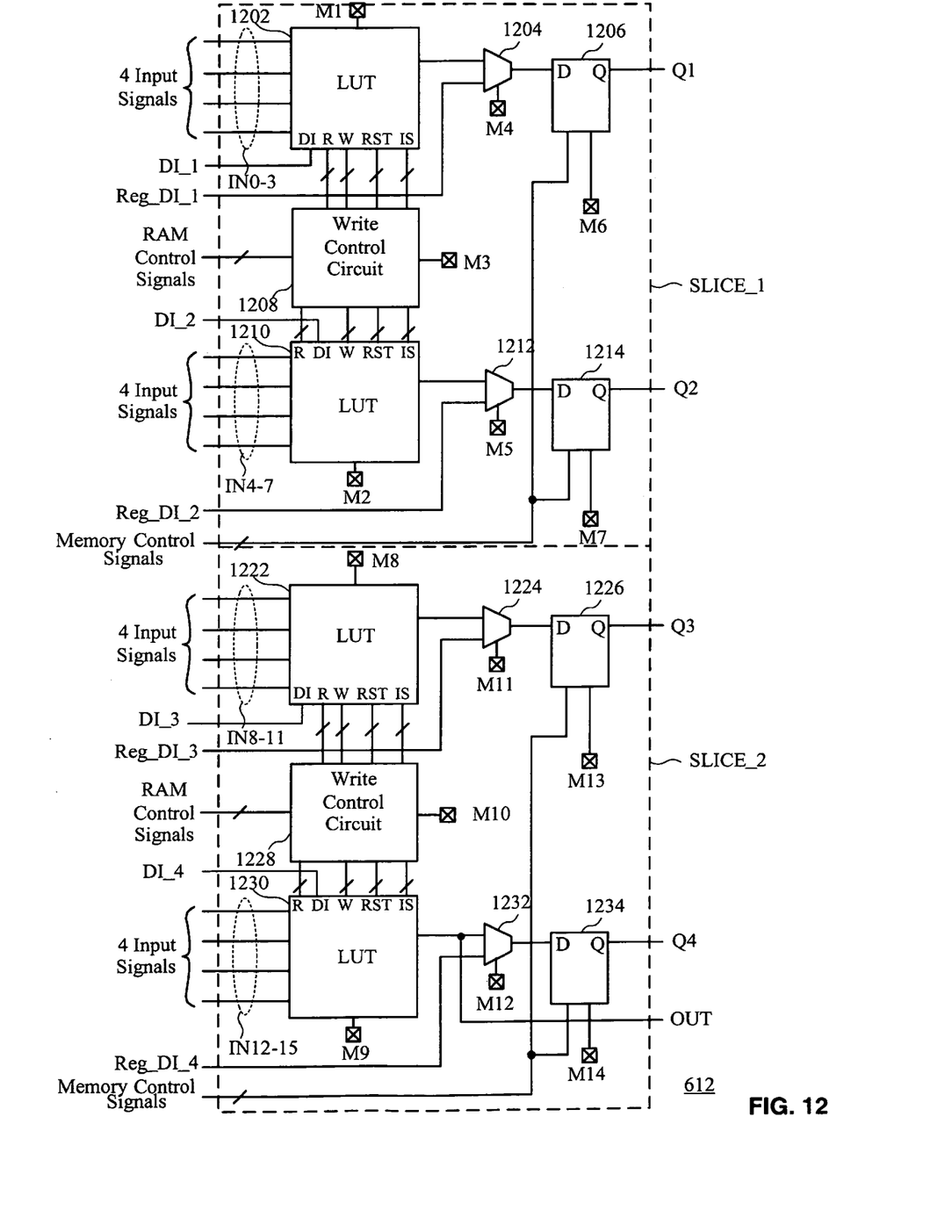
FIG. 12 is a block diagram of a configurable logic element of the programmable logic device of FIG. 11 according to an embodiment of the present invention.

Turning now to FIG. 12, a block diagram of a configurable logic element of the programmable logic device of FIG. 11 according to an embodiment of the present invention is shown. In particular, FIG. 12 illustrates in simplified form a configurable logic element of a configuration logic block 1102 of FIG. 11. The configurable logic element shown comprises two similar slices, where each slice comprises a pair of function generators. However, the configurable logic element may comprise more slices, such as four slices, for example. Each function generator may function in any of several modes depending upon the configuration data in the configuration memory elements M1-M14. As set forth above, the configuration memory elements M1-M14 may be changed during a partial reconfiguration of an FPGA to change the mode of the function generator. When in RAM mode, input data is supplied by an input terminal DI_1, DI_2 to the data input (DI) terminal of the associated function generator. Each function generator provides an output signal to an associated multiplexer, which selects between the output signal function generator and an associated register direct input signal Reg_DI_1, Reg_DI_2 from the programmable interconnect element. Thus, each function generator may be optionally bypassed. When in look-up table mode, each function generator implemented as a look-up table has four data input signals IN0-IN3. Slice 1 comprises a function generator implemented as a LUT 1202 coupled to a multiplexer 1204. In particular, the LUT 1202 receives 4 input signals which are decoded to generate an output associated with data stored in the LUT at the address designated by the input signals. The multiplexer 1204 is adapted to receive the output of LUT 1202 and a registered value of Reg_DI_1. The output of the multiplexer 1204 is coupled to a register 1206 which generates an output Q1.

A Write Control Circuit 1208 is coupled to receive RAM control signals and generate signals to control the LUT 1202. In addition to a data input (DI) coupled to receive RAM_DI_1 and conventional read and write control signals coupled to a read enable input (R) and a write enable input (W), the LUT 1202 comprises a partial reset input (RST) for receiving a partial reset signal, and an initial state input (IS) for receiving an initial state signal. Such resetting of the memory elements enables resetting the LUT memory cells during a partial reconfiguration of a programmable logic device, including partial reconfiguration of a device during operation. Similarly, slice 1 comprises a function generator implemented as a LUT 1210 coupled to a multiplexer 1212. The LUT 1210 is adapted to receive input signals IN4-IN7, while the multiplexer 1212 is coupled to receive the output of the LUT 1210 and a registered value of Reg_DI_2. The output of the multiplexer 1212 is coupled to a register 1214 which generates an output Q2. The write control circuit 1208 also generates a partial reset signal and an initial state signal for selectively resetting or setting one or more of the bits of the LUT 1210. One advantage of resetting LUT memory elements of a device during partial reconfiguration is that it is not necessary to cycle through the required clock cycles to set the correct data after the partial reconfiguration.

Similarly, slice 2 comprises a function generator implemented as a LUT 1222 coupled to a multiplexer 1224. The LUT 1222 is adapted to receive input signals IN8-IN11, while the multiplexer 1224 is coupled to receive the output of the LUT 1222 and a registered value of Reg_DI_3. The output of the multiplexer 1224 is coupled to a register 1226 which generates an output Q3. A Write Control Circuit 1228 is coupled to receive RAM control signals and generate signals to control the LUT 1222. In particular, input signals IN8-IN11 are decoded to generate an output associated with data stored in the LUT at the address designated by the input signals. The LUT 1222 comprises a partial reset input (RST) for receiving a partial reset signal, and an initial state input (IS) for receiving an initial state signal. Similarly, slice 2 comprises a function generator implemented as a LUT 1230 coupled to a multiplexer 1232. The LUT 1230 is adapted to receive input signals IN12-IN15, while the multiplexer 1232 is coupled to receive the output of the LUT 1230 and a registered value of Reg_DI_4. The output of the multiplexer 1232 is coupled to a register 1234 which generates an output Q4. The write control circuit 1228 also generates a partial reset signal and an initial state signal for selectively resetting or setting one or more of the bits of the LUT 1230.

Figure 13:
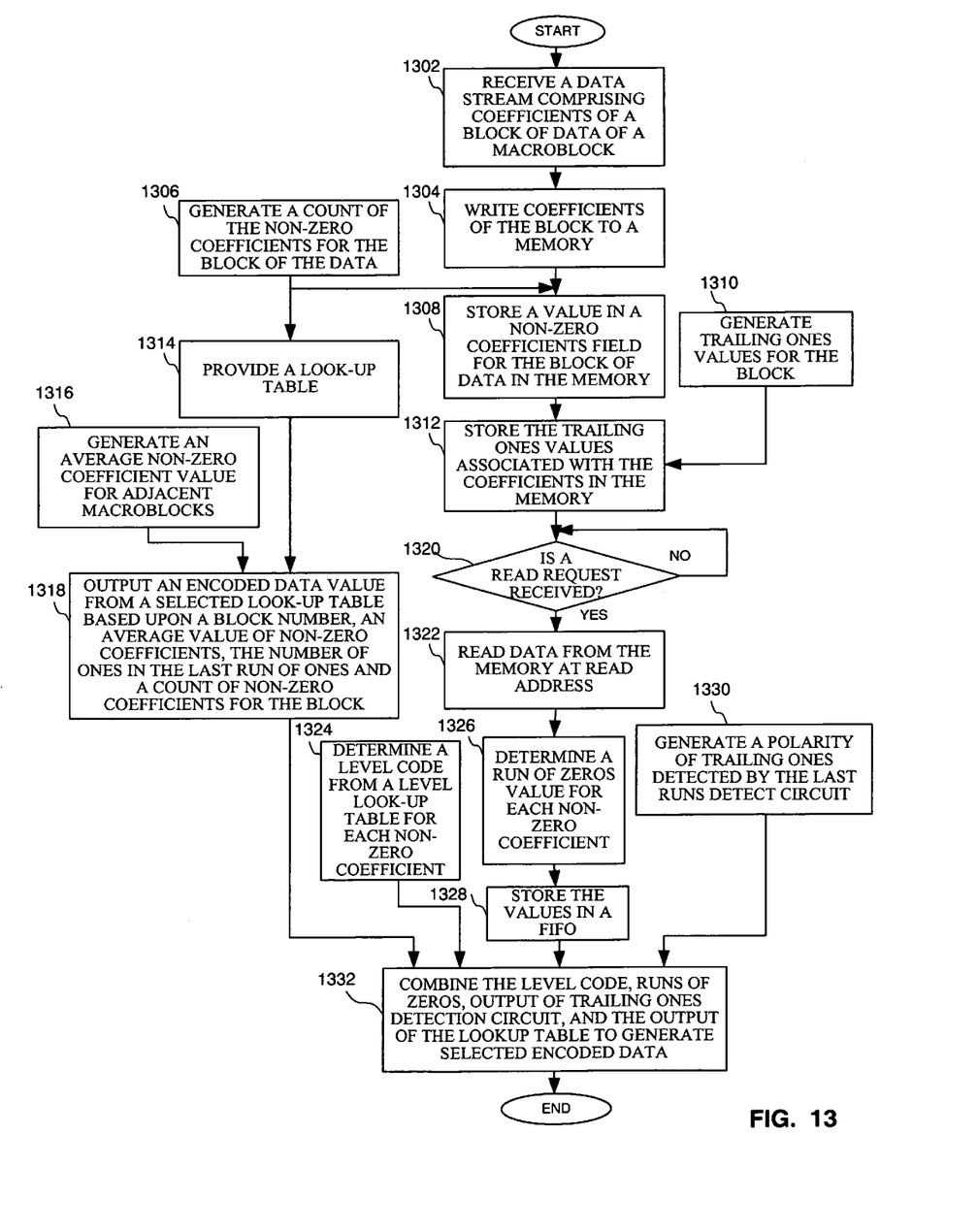
FIG. 13 is a flow chart showing a method of encoding a data stream according to an embodiment of the present invention.

Turning now to FIG. 13, a flow chart shows a method of encoding a data stream according to an embodiment of the present invention. The methods of FIG. 13, as well as the following FIG. 14, may be implanted using any of the circuits of FIGS. 1-12 as described above for each circuit, or any other suitable circuit. A data stream comprising non-encrypted data is received at a step 1302. Data is written to a memory at a step 1304. A count of the non-zero coefficients for blocks of the data stream is generated at a step 1306. A non-zero value associated with each non-zero coefficient is stored in the memory at a step 1308. A trailing ones value is generated at a step 1310. The trailing ones value associated with the data is stored in the memory at a step 1312. Look-up tables are provided at a step 1314. An average non-zero coefficient value for the block of data is generated at a step 1316. An encoded data value is output from a selected look-up table based upon a block number, an average non-zero coefficient value, a trailing ones value and a non-zero coefficient count for the block at a step 1318. It is then determined whether a read request is received at a step 1320. If so, data at the read address is read at a step 1322. A level code for a level look-up table for the plurality of blocks is determined for each non-zero coefficient at a step 1324 based upon the data stored in memory. A "zeros run" value, representing the number of zeros before or after a non-zero coefficient, is determined at a step 1326, and stored in a FIFO at a step 1328. An output of last runs detect circuit indicating the polarity of the ones of the last run of ones is generated at a step 1330. The level code, zeros run value, the output of last runs detect, and the output of the lookup table are combined to generate encoded data at a step 1332.

Figure 14:
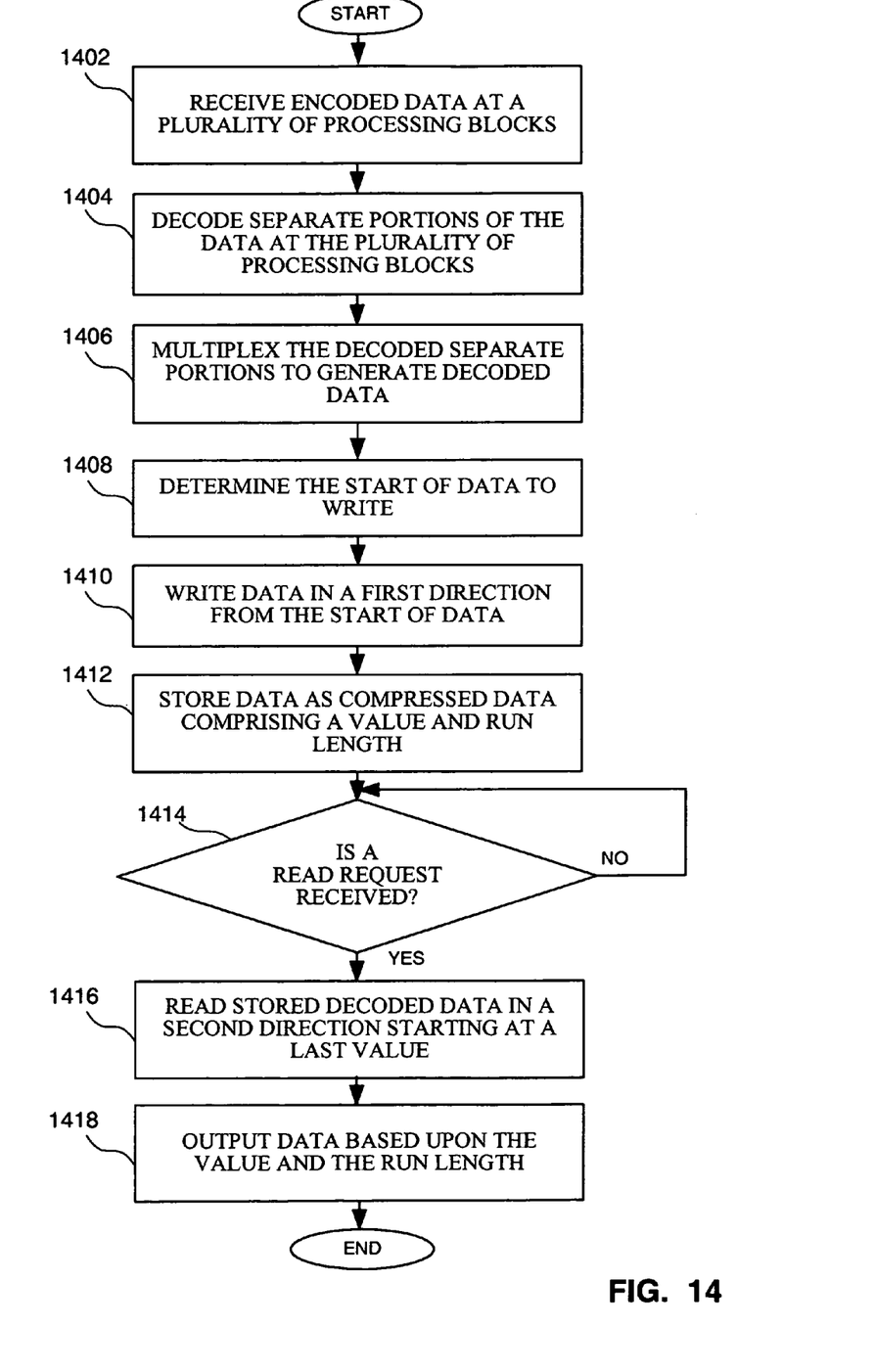
FIG. 14 is a flow chart showing a method decoding a data stream according to an embodiment the present invention.

Turning now to FIG. 14, a flow chart shows a method decoding a data stream according to an embodiment the present invention. Encoded data is received at a plurality of processing blocks at a step 1402. Separate portions of the data are decoded at the plurality of processing blocks at a step 1404. The decoded separate portions are multiplexed to generate decoded data at a step 1406. The start of data to write to memory is determined at a step 1408. Data is then written in a first direction from the start of data at a step 1410. Data is then stored as compressed decoded data comprising a value and run length at a step 1412. It is then determined if a read request is received at a step 1414. If so, data starting at a last value that was stored is read from the memory at a step 1416. The decoded data based upon the values and the run lengths stored in the memory is output at a step 1418.

Accordingly, the circuits and methods of the present invention enable efficient decoding of a video data stream, and may be incorporated into a system on a chip architecture that has a fully functional design in the absence of a processor. It is also capable of handling HDTV rates in a massively parallel environment, and therefore lends itself to a full duplex solution that makes conventional processor based approaches unacceptable due to high data rates necessary for many consumer applications. The circuits and methods may be extended to any MPEG based designs that employ a context adaptive variable length coding technique, such as the techniques that currently exists in the MPEG AVC architecture. The circuits and methods described above provide an extremely fast and parallel design of an efficient variable length coding (VLC) circuit that may be incorporated into a system on a chip, such as an FPGA or an application-specific integratred circuit (ASIC) or application-specific standard product (ASSP). It may therefore be appreciated that the new and novel circuit for and method of decoding a data stream has been described. It will be appreciated by those skilled in the art that numerous alternatives and equivalents will be seen to exist which incorporate the disclosed invention. As a result, the invention is not to be limited by the foregoing embodiments, but only by the following claims.

What is claimed is:

1. A circuit for encoding a data stream, said circuit comprising:
a non-zero count circuit coupled to receive said data stream and output a count of non-zero coefficients of a block of data of said data stream;
a trailing ones detection circuit coupled to receive said data stream and output a number of trailing ones of said block of data; and
a memory coupled to said non-zero count circuit and said trailing ones detection circuit and storing encoded data values, said memory outputting an encoded data value for a non-zero coefficient of a block of data based upon the count of non-zero coefficients and the number of trailing ones for said block of data;
wherein said memory comprises a plurality of lookup tables which outputs said encoded data value from a lookup table selected based upon a block number of a current macroblock being encoded.

2. The circuit of claim 1 further comprising a second memory coupled to receive said data stream and store a coefficient for each sample of a block of data.

3. The circuit of claim 2 wherein said second memory coupled to receive said data stream further comprises a non-zero value field, said non-zero value field storing an indication of whether a coefficient in a memory location comprises non-zero data.

4. The circuit of claim 2 wherein said second memory coupled to receive said data stream further comprises a ones column field, said ones column field storing an indication of whether a coefficient in a memory location is a trailing one.

5. The circuit of claim 1 further comprising a zero run detection circuit coupled to said memory coupled to receive said data stream, said zero run detection circuit generating a value indicating the number of ones adjacent to a non-zero coefficient.

6. The circuit of claim 1 further comprising a level lookup circuit coupled to said memory coupled to receive said data stream, said level lookup table outputting a level code associated with a non-zero coefficient.

7. A circuit for encoding a data stream, said circuit comprising:
a memory for storing coefficients of a block of data of said data stream;
a zero run detection circuit coupled to said memory, said zero run detection circuit determining, for each non-zero coefficient, a run of zeroes adjacent to the non-zero coefficient;
a FIFO coupled to said zero run detection circuit, said FIFO storing a run length of zeros for each non-zero coefficient of said block of data read from said memory; and
a level lookup table coupled to receive said coefficients of said memory, said level lookup table generating a level code associated with each non-zero coefficient stored in said memory.

8. The circuit of claim 7 further comprising a non-zero count circuit coupled to receive said data stream, said non-zero count circuit determining a number of non-zero coefficients of said block of data.

9. The circuit of claim 8 wherein said memory comprises a field for storing a non-zero value indicator for each coefficient stored in said memory.

10. The circuit of claim 7 further comprising a trailing ones detection circuit coupled to receive said data stream, said trailing ones detection circuit generating a number of trailing ones of said block of data.

11. The circuit of claim 10 wherein said trailing ones detection circuit further generates an indication to be stored in a ones column field for each non-zero coefficient comprising a trailing one.

12. The circuit of claim 7 wherein at least a portion of said circuit is implemented in programmable logic of a programmable logic device.

13. A method of encoding a data stream, said method comprising the steps of:
   receiving a data stream comprising blocks of data;
   generating a count of non-zero coefficients for a block of data in a first hardware logic circuit;
   generating a trailing ones value for said block of data in a second hardware logic circuit;
   generating encoded data for said block of data based upon said count of non-zero coefficients and said trailing ones value; and
   selecting a level code from a level lookup table, for each non-zero coefficient, associated with the non-zero coefficient.

14. The method of claim 13 further comprising a step of detecting a runs of ones adjacent to a non-zero coefficient.

15. The method of claim 14 further comprising a step of storing a value for a run of ones adjacent to a non-zero coefficient, for each non-zero coefficient, in a FIFO.

16. The method of claim 13 further comprising a step of storing encoded data in a memory having a plurality of lookup tables, said encoded data being associated with said count of non-zero coefficients and said trailing ones value.

17. The method of claim 13 wherein said steps of generating a count of non-zero coefficients for a block of data in a first hardware logic circuit and generating a trailing ones value for the block of data in a second hardware circuit comprise a step of implementing said first hardware logic circuit and said second hardware logic circuit in programmable logic.

* * * * *